United States Patent
Teraoka

(10) Patent No.: US 9,591,762 B2
(45) Date of Patent: Mar. 7, 2017

(54) MULTILAYER CERAMIC CAPACITOR, MOUNTING STRUCTURE OF MULTILAYER CERAMIC CAPACITOR, AND TAPED ELECTRONIC COMPONENT ARRAY

(71) Applicant: Murata Manufacturing Co., Ltd., Nagaokakyo-shi, Kyoto-fu (JP)

(72) Inventor: Eiji Teraoka, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 15/003,879

(22) Filed: Jan. 22, 2016

(65) Prior Publication Data
US 2016/0227650 A1   Aug. 4, 2016

(30) Foreign Application Priority Data

Jan. 31, 2015   (JP) .................................. 2015-018010
Nov. 14, 2015   (JP) .................................. 2015-223539

(51) Int. Cl.

| H05K 1/18 | (2006.01) |
|---|---|
| H01G 4/248 | (2006.01) |
| H01G 4/232 | (2006.01) |
| H01G 4/012 | (2006.01) |
| H05K 1/02 | (2006.01) |
| H01G 4/30 | (2006.01) |
| H01G 4/12 | (2006.01) |

(52) U.S. Cl.
CPC ............ *H05K 1/181* (2013.01); *H01G 4/012* (2013.01); *H01G 4/12* (2013.01); *H01G 4/232* (2013.01); *H01G 4/248* (2013.01); *H01G 4/30* (2013.01); *H05K 2201/10015* (2013.01)

(58) Field of Classification Search
CPC ...................................................... H01G 4/30
See application file for complete search history.

(56) References Cited

U.S. PATENT DOCUMENTS

| 2008/0080120 A1* | 4/2008 | Togashi | ................. | H01G 4/012 |
|---|---|---|---|---|
| | | | | 361/301.4 |
| 2012/0018204 A1* | 1/2012 | Sato | ....................... | H01G 4/232 |
| | | | | 174/260 |
| 2012/0313489 A1* | 12/2012 | Shirakawa | ............... | H01G 4/30 |
| | | | | 310/365 |
| 2015/0014037 A1* | 1/2015 | Ahn | ......................... | H01G 4/30 |
| | | | | 174/260 |
| 2015/0092316 A1* | 4/2015 | Chun | ....................... | H01G 4/30 |
| | | | | 361/301.4 |

FOREIGN PATENT DOCUMENTS

JP          2000-306762 A          11/2000

* cited by examiner

*Primary Examiner* — Timothy Thompson
*Assistant Examiner* — Amol Patel
(74) *Attorney, Agent, or Firm* — Keating & Bennett, LLP

(57) ABSTRACT

A multilayer ceramic capacitor includes a stacked body including a stack of a plurality of dielectric layers and a plurality of internal electrodes, and a pair of external electrodes. In the stacked body, a width dimension is greater than a thickness dimension, a length dimension preferably is about 0.4 mm or less, a width dimension preferably is about 0.15 mm or more and about 0.35 mm or less, a thickness dimension preferably is about 0.2 mm or less, and each of the internal electrodes is made of Cu or Ag as a main component and has a width dimension that is about 60% or more of the width dimension of the stacked body.

17 Claims, 11 Drawing Sheets

MULTILAYER CERAMIC CAPACITOR, MOUNTING STRUCTURE OF MULTILAYER CERAMIC CAPACITOR, AND TAPED ELECTRONIC COMPONENT ARRAY

BACKGROUND OF THE INVENTION

1. Field of the Invention

The present invention relates to a multilayer ceramic capacitor, a mounting structure of the multilayer ceramic capacitor, and a taped electronic component array.

2. Description of the Related Art

As electronic devices have been reduced in size in recent years, size reduction of multilayer ceramic capacitors used in these electronic devices have also been demanded.

Also, since the operation frequency has been rising in electronic devices such as a power amplifier (PA) module, the multilayer ceramic capacitor used therein is also required to exhibit few losses, a low ESR (Equivalent Series Resistance) and a high Q value in a high frequency region. The high frequency region corresponds to a range of 100 MHz or more and 100 GHz or less, for example.

Japanese Patent Laying-Open No. 2000-306762 discloses a multilayer ceramic capacitor in which a high Q value is implemented in a high frequency region.

In the multilayer ceramic capacitor disclosed in Japanese Patent Laying-Open No. 2000-306762, the thickness of the internal electrode is increased so as to lower the electric resistance value of the internal electrode and to raise the Q value. Japanese Patent Laying-Open No. 2000-306762 discloses that, for example, in the case where Pd is used as a main component of the internal electrode, a relatively larger Q value can be obtained by forming this internal electrode to have a thickness of 12 μm or more. Furthermore, it also discloses that, in the case where Ag or Cu is used as a main component of the internal electrode, a relatively larger Q value can be obtained by forming this internal electrode to have a thickness of 9 μm or more.

Since the multilayer ceramic capacitor disclosed in Japanese Patent Laying-Open No. 2000-306762 includes an internal electrode having a relatively large thickness (12 μm or more in the case of Pd as a main component of the internal electrode; and 9 μm or more in the case of Ag and Cu as main components of the internal electrode), the demand for size reduction required for the multilayer ceramic capacitor could not be satisfied.

Furthermore, the multilayer ceramic capacitor disclosed in Japanese Patent Laying-Open No. 2000-306762 includes an internal electrode having a relatively larger thickness. Accordingly, during firing, peeling may occur in the interface between the internal electrode and the dielectric ceramic layer due to the difference of shrinkage between the internal electrode and the dielectric ceramic layer.

SUMMARY OF THE INVENTION

According to a preferred embodiment of the present invention, a multilayer ceramic capacitor includes a stacked body including a stack of a plurality of dielectric layers and a plurality of internal electrodes, and including a first main surface and a second main surface that are opposed to each other in a stacking direction, a first side surface and a second side surface that are opposed to each other in a width direction perpendicular or substantially perpendicular to the stacking direction, and a first end surface and a second end surface that are opposed to each other in a length direction perpendicular or substantially perpendicular to each of the stacking direction and the width direction; and a pair of external electrodes provided on the first end surface and the second end surface, respectively, of the stacked body. Each of the internal electrodes is connected at one of the first end surface and the second end surface to a corresponding one of the external electrodes. In the stacked body, assuming that a dimension between the first end surface and the second end surface is defined as a length dimension, a dimension between the first side surface and the second side surface is defined as a width dimension, and a dimension between the first main surface and the second main surface is defined as a thickness dimension, the width dimension is greater than the thickness dimension. The length dimension preferably is about 0.4 mm or less, for example. The width dimension preferably is about 0.15 mm or more and about 0.35 mm or less, for example. The thickness dimension preferably is about 0.2 mm or less, for example. The internal electrode is made of Cu or Ag as a main component. A width dimension of the internal electrode preferably is about 60% or more of the width dimension of the stacked body, for example.

It is preferable that the internal electrode preferably has a thickness dimension of about 1.2 μm or more and about 2.4 μm or less, for example. It is not preferable that the thickness dimension of the internal electrode is less than about 1.2 μm since a Q value is decreased. Furthermore, when the thickness dimension of the internal electrode is greater than about 2.4 μm, peeling may occur in the interface between the internal electrode and the dielectric ceramic layer during firing due to the difference of shrinkage between the internal electrode and the dielectric ceramic layer.

It is preferable that a dimension of a width gap having no internal electrode provided therein between the internal electrode and the first side surface or the second side surface of the stacked body is about 25 μm or more, for example. When the dimension of the width gap is smaller than about 25 μm, moisture enters through the side surface of the stacked body and reaches the internal electrode, so that it becomes difficult to ensure moisture resistance.

It is preferable that a number of the plurality of internal electrodes that are adjacent to each other continuously in the stacking direction are connected to one of the external electrodes, and a number of the plurality of internal electrodes that are adjacent to each other continuously in the stacking direction and not connected to the one of the external electrodes are connected to the other of the external electrodes. In this case, even if the thickness dimension of one internal electrode is relatively small, overall conductivity is ensured by the plurality of internal electrodes, so that a decrease in the Q value is significantly reduced or prevented.

In this case, it is more preferable that two of the internal electrodes that are adjacent to each other continuously in the stacking direction are connected to one of the external electrodes, and two of the internal electrodes that are adjacent to each other continuously in the stacking direction and not connected to the one of the external electrodes are connected to the other of the external electrodes. If the number of the internal electrodes adjacent to each other continuously in the stacking direction and connected to one or the other of the external electrodes is three or more, the number of internal electrodes required to provide a capacitance is difficult to be ensured within the limited thickness dimension of the stacked body.

It is preferable that an auxiliary electrode is further provided inside the stacked body. In this case, the connectivity between the external electrode and the internal electrode is improved, so that the connection resistance between the external electrode and the internal electrode is lowered.

In a mounting structure of a multilayer ceramic capacitor according to the second aspect of various preferred embodiments of the present invention, the external electrode of the multilayer ceramic capacitor according to the first aspect of various preferred embodiments of the present invention described above is joined by solder to a land electrode provided on a substrate. A normal direction of the internal electrode in the multilayer ceramic capacitor and a normal direction of the substrate are perpendicular or substantially perpendicular to each other. In this case, since the internal electrode is perpendicular or substantially perpendicular to the substrate, a current flows uniformly through each element including one dielectric ceramic layer and two internal electrodes sandwiching this dielectric ceramic layer therebetween, so that a Q value in the high frequency region is increased.

In a mounting structure of a multilayer ceramic capacitor according to the third aspect of various preferred embodiments of the present invention, the external electrode of the multilayer ceramic capacitor according to the first aspect of various preferred embodiments of the present invention described above is joined by solder to a land electrode provided on a substrate. The stacked body is disposed such that the first side surface or the second side surface of the stacked body faces the substrate. Also in this case, since the internal electrode is perpendicular or substantially perpendicular to the substrate, a current flows uniformly through each element including one dielectric ceramic layer and two internal electrodes sandwiching this dielectric ceramic layer therebetween, so that a Q value in the high frequency region is increased.

A taped electronic component array according to the fourth aspect of various preferred embodiments of the present invention includes an elongated carrier tape in which a plurality of concave portions are provided; and an elongated cover tape covering the plurality of concave portions in the carrier tape. The multilayer ceramic capacitor according to the first aspect of various preferred embodiments of the present invention is housed in each of the plurality of concave portions. A normal direction of the internal electrode in the multilayer ceramic capacitor and a normal direction of a bottom surface of each of the plurality of concave portions are perpendicular or substantially perpendicular to each other. In this case, when the cover tape is peeled from the carrier tape, the first side surface or the second side surface of the stacked body of the multilayer ceramic capacitor is located in an opening of the concave portion. When this side surface is adsorbed, for example, by vacuum absorption using a mounting machine and mounted on the substrate, the mounting structure of the multilayer ceramic capacitor according to the second or third aspect of various preferred embodiments of the present invention described above is able to be readily implemented.

A taped electronic component array according to the fifth aspect of various preferred embodiments of the present invention includes an elongated carrier tape in which a plurality of concave portions are provided; and an elongated cover tape covering the plurality of concave portions in the carrier tape. The multilayer ceramic capacitor according to the first aspect of various preferred embodiments of the present invention is housed in each of the plurality of concave portions. The first side surface or the second side surface of the stacked body of the multilayer ceramic capacitor is disposed so as to face a bottom surface of each of the plurality of concave portions. Also in this case, when the cover tape is peeled from the carrier tape, the first side surface or the second side surface of the stacked body of the multilayer ceramic capacitor is located in an opening of each of the plurality of concave portions. Thus, when this side surface is adsorbed, for example, by vacuum absorption using a mounting machine and mounted on the substrate, the mounting structure of the multilayer ceramic capacitor according to the second or third aspect of various preferred embodiments of the present invention described above is able to be readily implemented.

According to the multilayer ceramic capacitor based on the first aspect of various preferred embodiments of the present invention, the Q value in the high frequency region is increased. Furthermore, according to the mounting structure of the multilayer ceramic capacitor based on the second and third aspects of the present invention, the Q value in the high frequency region is increased. According to the taped electronic component array based on the fourth or fifth aspect of various preferred embodiments of the present invention, the mounting structure of the multilayer ceramic capacitor based on the second and third aspects of the present invention is able to be readily implemented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A multilayer ceramic capacitor, a mounting structure of the multilayer ceramic capacitor, and a taped electronic component array according to each preferred embodiment of the present invention will be hereinafter described.

First Preferred Embodiment

Figure 1:
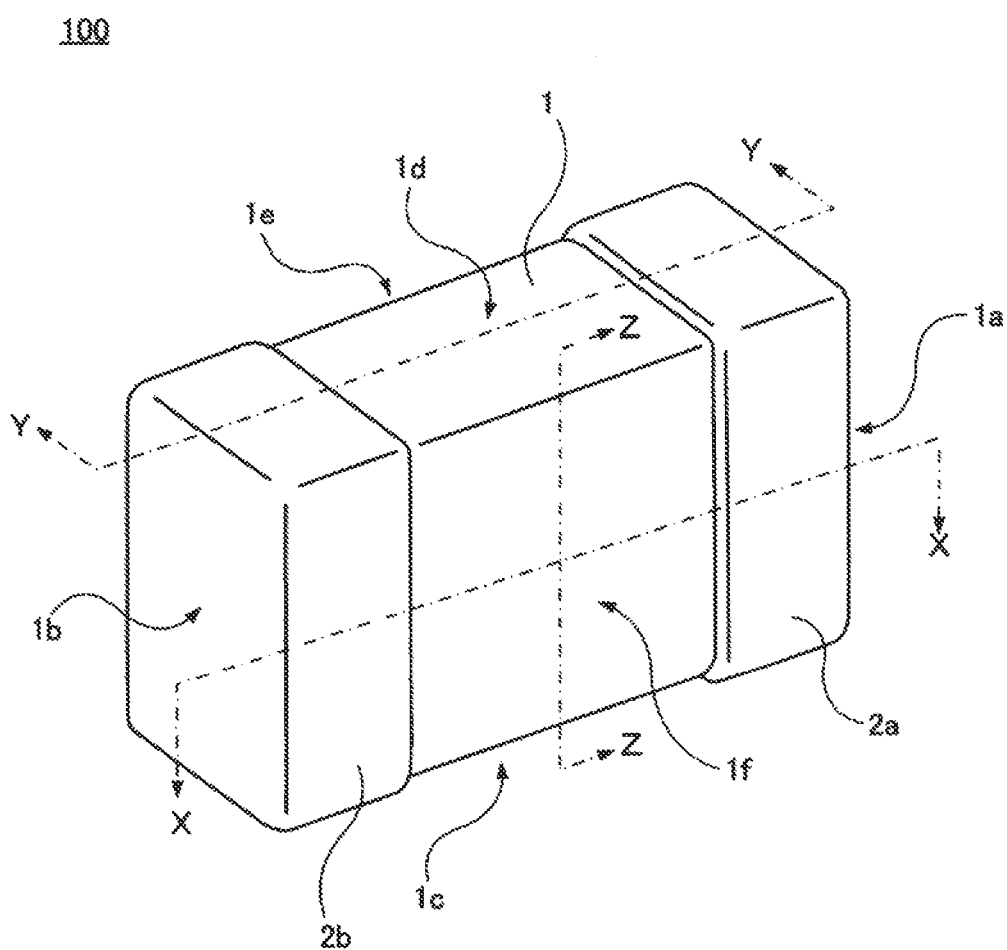
FIG. 1 is a perspective view showing a multilayer ceramic capacitor according to a first preferred embodiment of the present invention.
Figure 2:
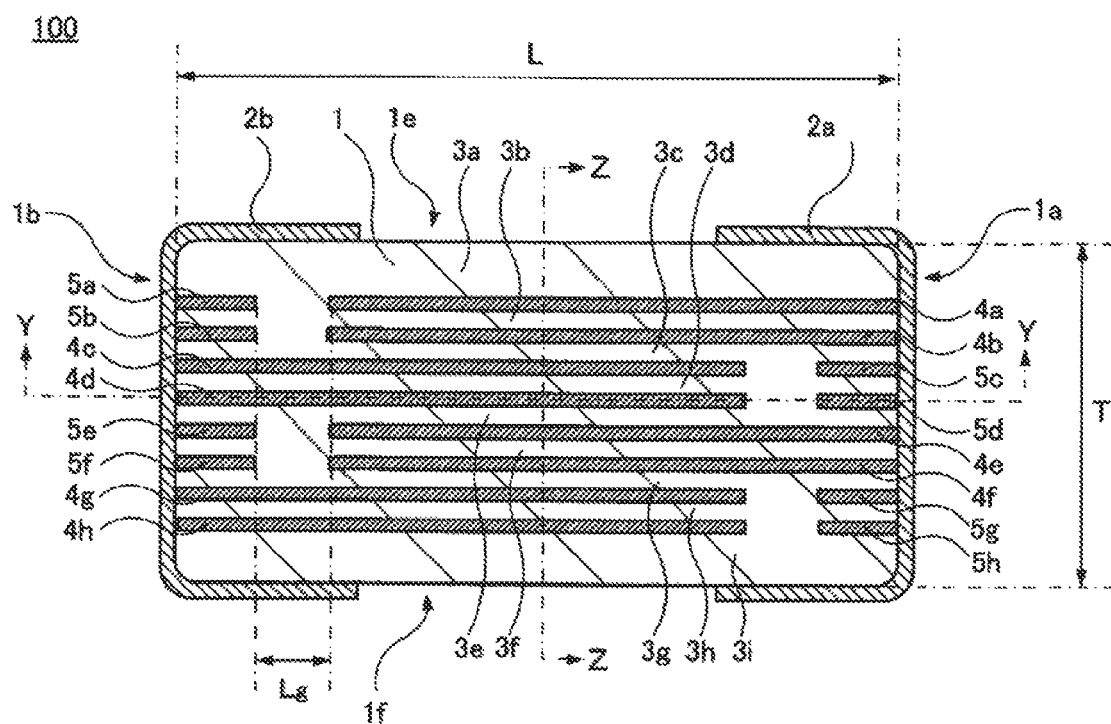
FIG. 2 is a cross-sectional view of the multilayer ceramic capacitor according to the first preferred embodiment of the present invention of the present invention, as seen in the direction indicated by line arrows X-X in FIG. 1.
Figure 3:
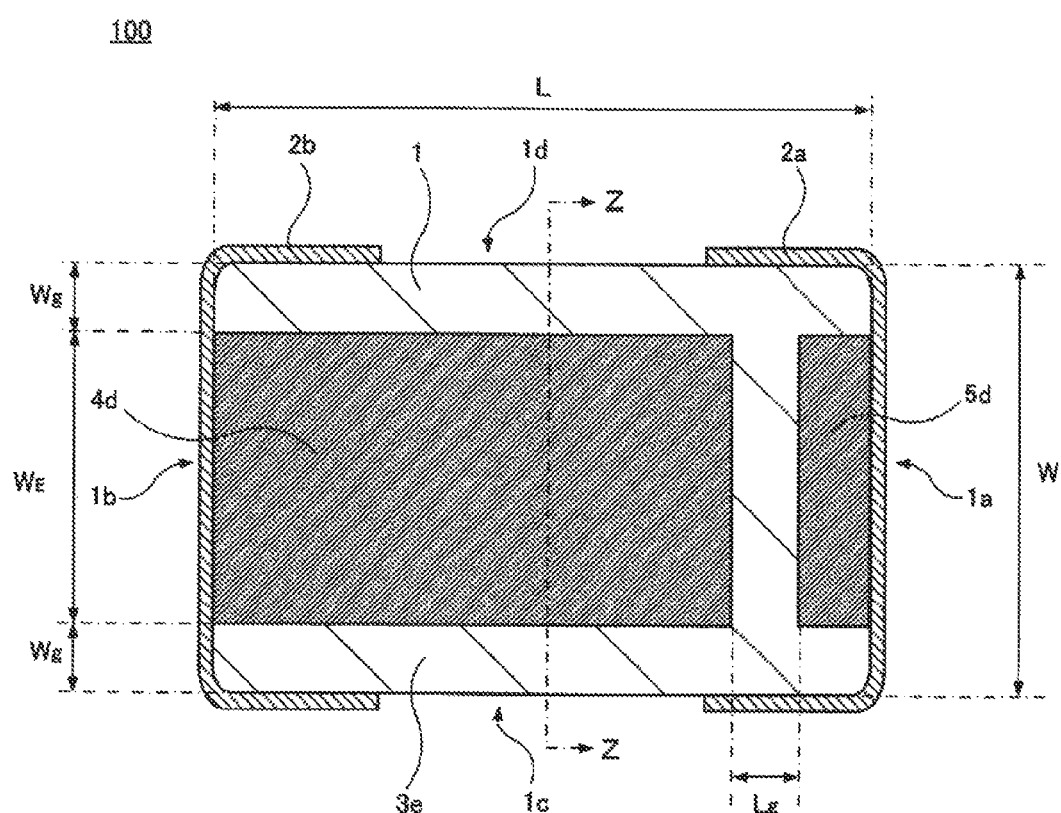
FIG. 3 is a cross-sectional view of the multilayer ceramic capacitor according to the first preferred embodiment of the present invention, as seen in the direction indicated by line arrows Y-Y in each of FIGS. 1 and 2.
Figure 4:
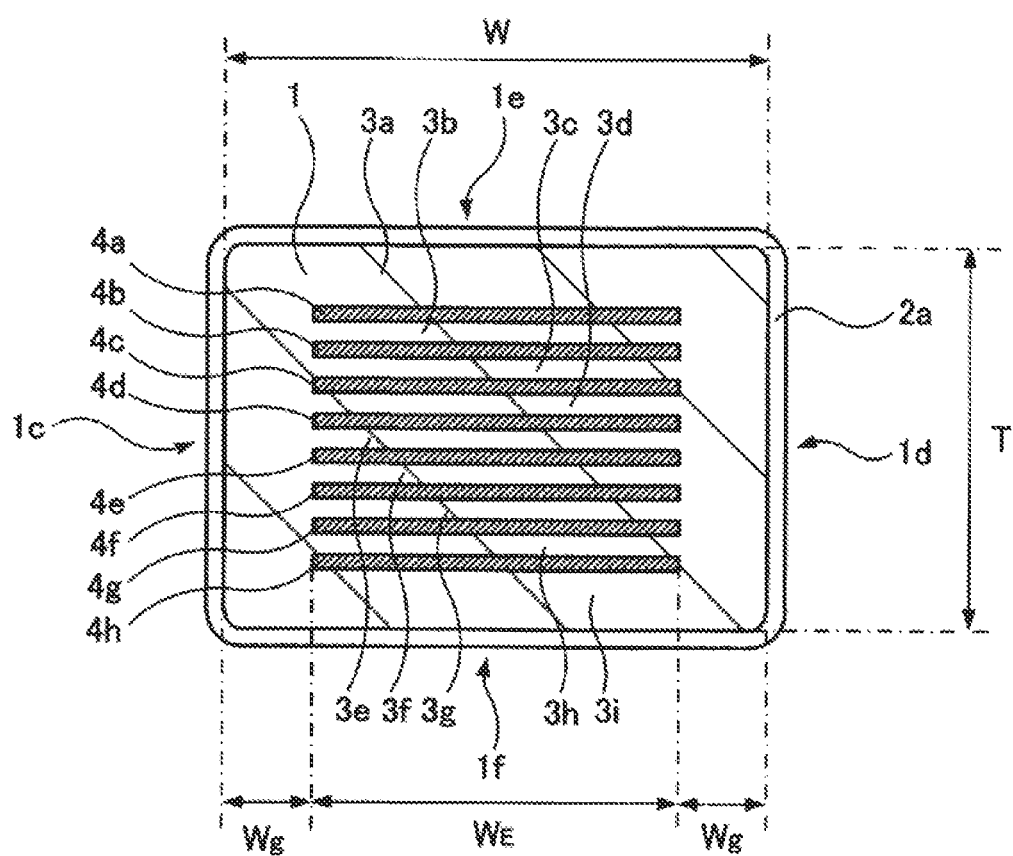
FIG. 4 is a cross-sectional view of the multilayer ceramic capacitor according to the first preferred embodiment of the present invention, as seen in the direction indicated by line arrows Z-Z in each of FIGS. 1 to 3.

FIG. 1 is a perspective view showing a multilayer ceramic capacitor according to the first preferred embodiment of the present invention. FIG. 2 is a cross-sectional view of the multilayer ceramic capacitor according to the first preferred embodiment of the present invention, as seen in the direction indicated by line arrows X-X in FIG. 1. FIG. 3 is a cross-sectional view of the multilayer ceramic capacitor according to the first preferred embodiment of the present invention, as seen in the direction indicated by line arrows Y-Y in each of FIGS. 1 and 2. FIG. 4 is a cross-sectional view of the multilayer ceramic capacitor according to the first preferred embodiment of the present invention, as seen in the direction indicated by line arrows Z-Z in each of FIGS. 1 to 3.

As shown in FIGS. 1 to 4, a multilayer ceramic capacitor 100 includes a stacked body 1. The stacked body 1 preferably has a rectangular or substantially rectangular parallelepiped shape including a first end surface 1a and a second end surface 1b, a first side surface 1c and a second side surface 1d, and a first main surface 1e and a second main surface 1f.

In the multilayer ceramic capacitor 100, assuming that the dimension between the first end surface 1a and the second end surface 1b is defined as a length dimension L, the dimension between the first side surface 1c and the second side surface 1d is defined as a width dimension W, and the dimension between the first main surface 1e and the second main surface 1f is defined as a thickness dimension T, and each of these dimensions satisfies the following conditions.

In the multilayer ceramic capacitor 100, the length dimension L preferably is about 0.4 mm or less, for example, the width dimension W preferably is about 0.35 mm or less, and the thickness dimension T preferably is about 0.2 mm or less, for example. In other words, the multilayer ceramic capacitor 100 is reduced in sized by reducing each of the length dimension L, the width dimension W and the thickness dimension T of the stacked body 1 as described above.

It is to be noted that the width dimension W of the stacked body 1 preferably is about 0.15 mm or more, for example. In the multilayer ceramic capacitor 100, the ratio of the width dimension $W_E$ of each of a plurality of internal electrodes 4a to 4h described later to the width dimension W of the stacked body 1 is increased, thus increasing the Q value in the high frequency region. Therefore, the lower limit value is set for the width dimension W of the stacked body 1. In addition, the width dimension W is greater than the thickness dimension T in the stacked body 1.

In the stacked body 1, the corner portion and the ridge line may be rounded at a prescribed radius of curvature or less. In the present preferred embodiment, the corner portion and the ridge line of the stacked body 1 are rounded by barrel polishing, for example.

The stacked body 1 is provided at its both ends with one pair of external electrodes 2a and 2b, respectively. The external electrode 2a preferably has a cap shape so as to extend around the stacked body 1 over each of the first end surface 1a, the first side surface 1c, the second side surface 1d, the first main surface 1e, and the second main surface 1f. The external electrode 2b preferably has a cap shape so as to extend around the stacked body 1 over each of the second end surface 1b, the first side surface 1c, the second side surface 1d, the first main surface 1e, and the second main surface 1f.

It is preferable that each of the pair of external electrodes 2a and 2b includes an underlying layer and a plating layer provided on the underlying layer, and this configuration is applied also in the present preferred embodiment. It should be noted that the external electrodes 2a and 2b are shown as one layer for convenience in the cross-sectional view in each of FIGS. 2 and 3 for ease of visibility.

It is to be noted that the underlying layer of each of the external electrodes 2a and 2b is not indispensable, but a plating layer may be formed directly on the stacked body 1.

The underlying layer of each of the pair of external electrodes 2a and 2b can be made, for example, using metal containing Cu, Ni, Ag, Pd, an Ag—Pd alloy, Au, or the like as a main component. It is to be noted that metal containing Cu as a main component is excellent in contactability with the internal electrodes 4a to 4h, which will be described later. In addition, the underlying layer may be formed by co-firing in which the underlying layer is fired simultaneously with the internal electrodes 4a to 4h, or may be formed by post-firing in which the underlying layer is applied with a conductive paste and baked.

In the case where an underlying layer of each of a pair of external electrodes 2a and 2b is provided, it is preferable that the underlying layer has a thickness of about 12 μm or more and about 20 μm or less, for example. The underlying layer having a thickness smaller than about 12 μm is not preferable since the sealing performance by the external electrode deteriorates. Also, the underlying layer having a thickness greater than about 20 μm is also not preferable since the ESR is increased.

The plating layer of each of a pair of external electrodes 2a and 2b can be made, for example, using metal containing Cu, Ni, Ag, Pd, an Ag—Pd alloy, Au, or the like as a main component.

The plating layer of each of a pair of external electrodes 2a and 2b may include a plurality of layers. For example, the plating layer of each of one pair of the external electrodes 2a and 2b may include two layers including an Ni plating layer and an Sn plating layer provided on the Ni plating layer. It is preferable that the thickness of one plating layer is about 1 μm to about 10 μm, for example.

The stacked body 1 includes a stack of a plurality of dielectric ceramic layers 3a to 3i and a plurality of internal electrodes 4a to 4h. As shown in the cross-sectional view in each of FIGS. 2 to 4, the number of the dielectric ceramic layers 3a to 3i preferably is nine and the number of the internal electrodes 4a to 4h is eight, for example. However, the number of the dielectric ceramic layers 3a to 3i and the number of the internal electrodes 4a to 4h are optional, and may be determined in accordance with the capacitance required for multilayer ceramic capacitor 100. It is to be noted that the number of the internal electrodes 4a to 4h is preferably 30 or less in order to reduce a thickness dimension T of the multilayer ceramic capacitor 100, for example.

The dielectric ceramic layers 3a to 3i each are preferably made, for example, of dielectric ceramics containing $CaZrO_3$ and the like as a main component. Alternatively, the dielectric ceramic layers 3a to 3i may be made of dielectric ceramics obtained by adding accessory components such as an Mn compound, an Si compound, and an Sr compound to a main component such as $CaZrO_3$. In addition, metal containing Cu as a main component may be used for the internal electrodes 4a to 4h. In this case, since the sintering temperature of Cu is relatively low, low-temperature sintered glass ($B_2O_3$, CaO, $Li_2O$, $SiO_2$, or the like) may be added to dielectric ceramics to lower the sintering temperature of the dielectric ceramics.

The internal electrodes 4a to 4h each are made of a metal material containing Cu or Ag as a main component. The internal electrodes 4a to 4h each are preferably made of a film preferably having a rectangular or substantially rectangular shape having a length dimension $L_E$ in the length direction of the stacked body 1, a width dimension $W_E$ in the width direction of the stacked body 1, and a thickness dimension $T_E$ in the thickness direction of the stacked body 1.

A length dimension $L_E$ of each of the internal electrodes 4a to 4h can be set so as to fall within a range of a length dimension L of the stacked body 1 in consideration of the capacitance and the like required for the multilayer ceramic capacitor 100. It is preferable that the thickness dimension $T_E$ of each of the internal electrodes 4a to 4h is about 1.2 μm or more and about 2.4 μm or less, for example. It is not preferable that the thickness dimension $T_E$ of each of the internal electrodes 4a to 4h is less than about 1.2 μm since the Q value is decreased. If the thickness dimension $T_E$ of each of the internal electrodes 4a to 4h is greater than about 2.4 μm, peeling may occur in the interface between the internal electrodes 4a to 4h and the dielectric ceramic layers 3a to 3i during firing due to the difference of shrinkage between the internal electrodes 4a to 4h and the dielectric ceramic layers.

In addition, the thickness dimension $T_E$ of each of the internal electrodes 4a to 4h is normally greater in the end portion in the width direction than in the center portion in the width direction. The thickness dimension $T_E$ of each of the internal electrodes 4a to 4h corresponds to a dimension of the thickness of the center portion in the width direction.

Figure 5:
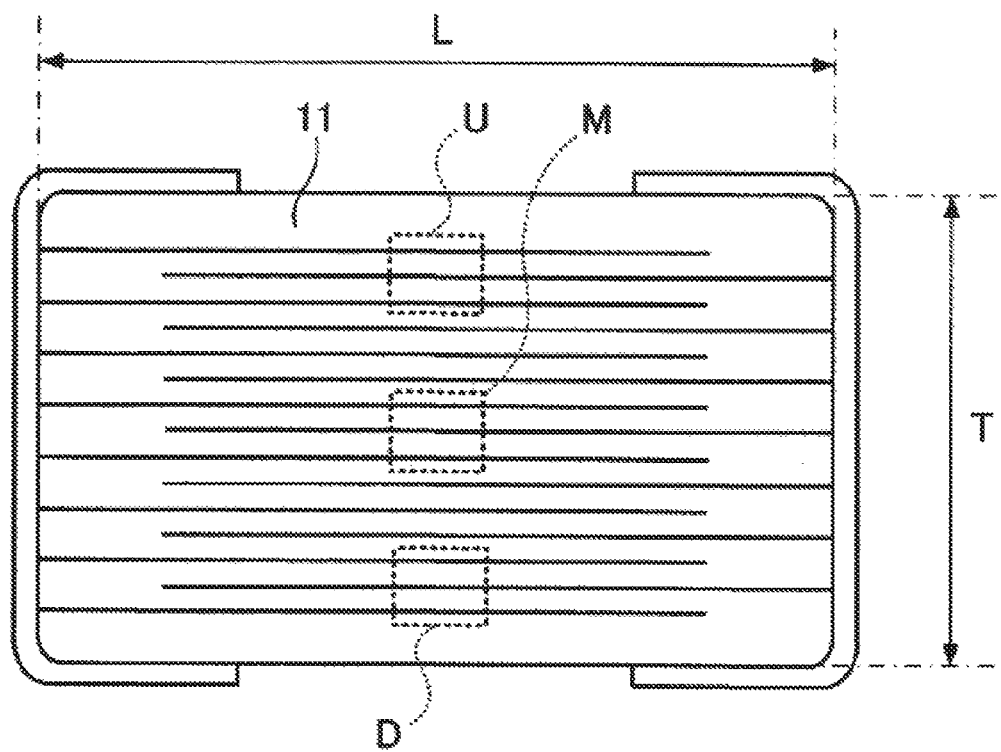
FIG. 5 is an L-T cross-sectional view showing a cross section of the multilayer ceramic capacitor as seen from the side surface side.
Figure 6:
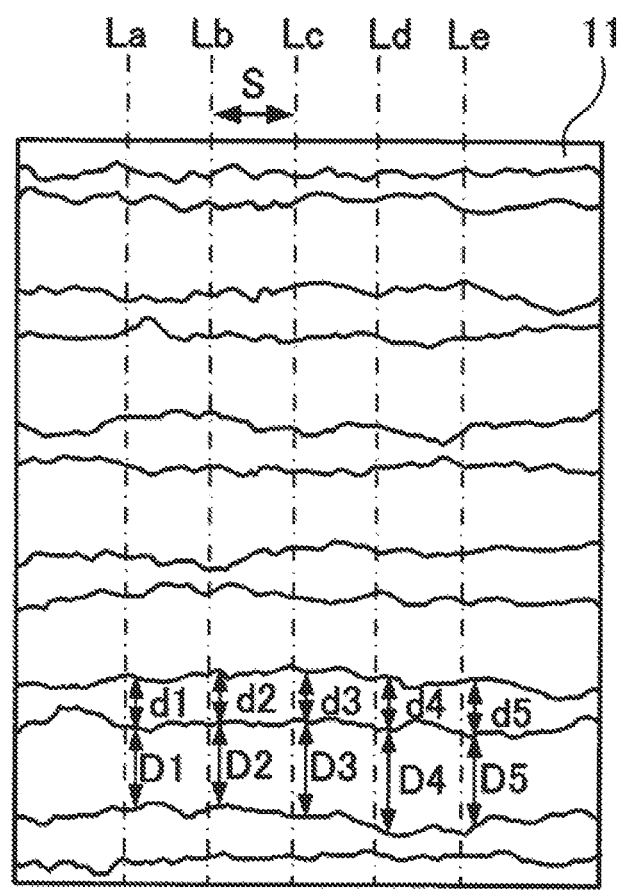
FIG. 6 is a partial cross-sectional view showing an image observed by an SEM.

Referring to FIGS. 5 and 6, the method of measuring the thickness dimension $T_E$ of the internal electrode will be hereinafter described. FIG. 5 is an L-T cross-sectional view showing a cross section of the multilayer ceramic capacitor as seen from the side surface side. FIG. 6 is a partial cross-sectional view showing an image observed by a Scanning Electron Microscope (which will be hereinafter abbreviated as an "SEM"). Furthermore, FIGS. 5 and 6 each show an ordinary multilayer ceramic capacitor, which includes a stacked body 11 whose connection structure and the like of the internal electrode are different in details from those of the stacked body 1 of the multilayer ceramic capacitor 100 according to the present preferred embodiment.

In the present specification, the thickness dimension $T_E$ of the internal electrode means an average thickness calculated by measuring the thicknesses of the plurality of internal electrodes.

In measurement, the stacked body 11 is first polished starting from its side surface to a position corresponding to one half of the width of the stacked body 11, thus exposing the L-T cross section shown in FIG. 5. The exposed L-T cross section is subjected to an etching process as required, thus removing the internal electrode extended by polishing.

Then, an SEM is used to observe three portions in the exposed L-T cross section that include an upper portion U, a center portion M and a lower portion D arranged in this order from the top in the stacking direction and located in the center in the length direction, as shown in FIG. 5. The magnification used for observation is set such that five dielectric ceramic layers and six internal electrodes can be observed, and such that each dielectric ceramic layer and each internal electrode can be clearly distinguished from each other.

When the thickness of the internal electrode of the multilayer ceramic capacitor is measured, five straight lines La to Le extending in the stacking direction of the stacked bodies 11 are first drawn at regular intervals (pitch S) in an enlarged image of the cross section of the multilayer ceramic capacitor, as shown in FIG. 6. A pitch S only has to be set to be about 5 times to 10 times the thickness of the internal electrode as a measurement target. For example, in the case where the internal electrode having a thickness of about 1 μm is measured, pitch S=5 μm. Then, the thickness of the internal electrode is measured on each of straight lines La to Le. In the case where the internal electrode is chipped on any of straight lines La to Le so that the dielectric ceramic layers sandwiching the internal electrode connect to each other, or in the case where the enlarged image at the measurement position is unclear, a new straight line is drawn, and the thickness of the internal electrode is measured on this new straight line.

Specifically, as shown in FIG. 6, a thickness dimension d1 on straight line La, a thickness dimension d2 on straight line Lb, a thickness dimension d3 on straight line Lc, a thickness dimension d4 on straight line Ld, and a thickness dimension d5 on straight line Le are measured. Then, an average value of the measured thickness dimensions are calculated and defined as a thickness dimension of the internal electrode. In the case where the thickness of the internal electrode is measured at the position of upper portion U or lower portion D in the L-T cross section, the outermost internal electrode in the stacking direction is excluded from measurement targets.

For calculating the thickness dimension $T_E$ of each of the plurality of internal electrodes, the thicknesses of 5 layers of internal electrodes in each of upper portion U, center portion M and lower portion D are measured by the above-described method to calculate an average value thereof, which is defined as the thickness dimension $T_E$ of each of the plurality of internal electrodes. In the case where the number of stacked internal electrodes is less than 5, the thicknesses of all internal electrodes are measured by the above-described method to calculate an average value thereof, which is defined as thickness dimension $T_E$ of each of the plurality of internal electrodes.

The method of measuring the thickness dimension $T_E$ of the internal electrode has been described as above. Also, the thickness of the dielectric ceramic layer can be measured by measuring the thickness dimension D1 on straight line La, thickness dimension D2 on straight line Lb, the thickness dimension D3 on straight line Lc, the thickness dimension D4 on straight line Ld, and the thickness dimension D5 on straight line Le in FIG. 6.

The description of the multilayer ceramic capacitor 100 according to the first preferred embodiment will be hereinafter resumed.

A width dimension $W_E$ of each of the internal electrodes 4a to 4h is preferably about 60% or more of the width dimension W of the stacked body 1. Thus, also in the case where the thickness dimension $T_E$ of each of the internal electrodes 4a to 4h is relatively small, the electric resistance value of each of the internal electrodes 4a to 4h is kept small, so that the Q value in the high frequency region is increased.

From the viewpoint as described above, it is desirable that the width dimension $W_E$ of each of the internal electrodes 4a to 4h is set as large as possible. However, it is preferable that a dimension Wg of the width gap having no internal electrodes 4a to 4h provided therein between a corresponding one of the internal electrodes 4a to 4h and the first side surface 1c or the second side surface 1d of stacked body 1 is about 25 μm or more, for example. When the dimension Wg of the width gap is smaller than about 25 μm, moisture enters through the first side surface 1c or the second side surface 1d and reaches the internal electrodes 4a to 4h, so that it becomes difficult to ensure the moisture resistance.

Figure 7:
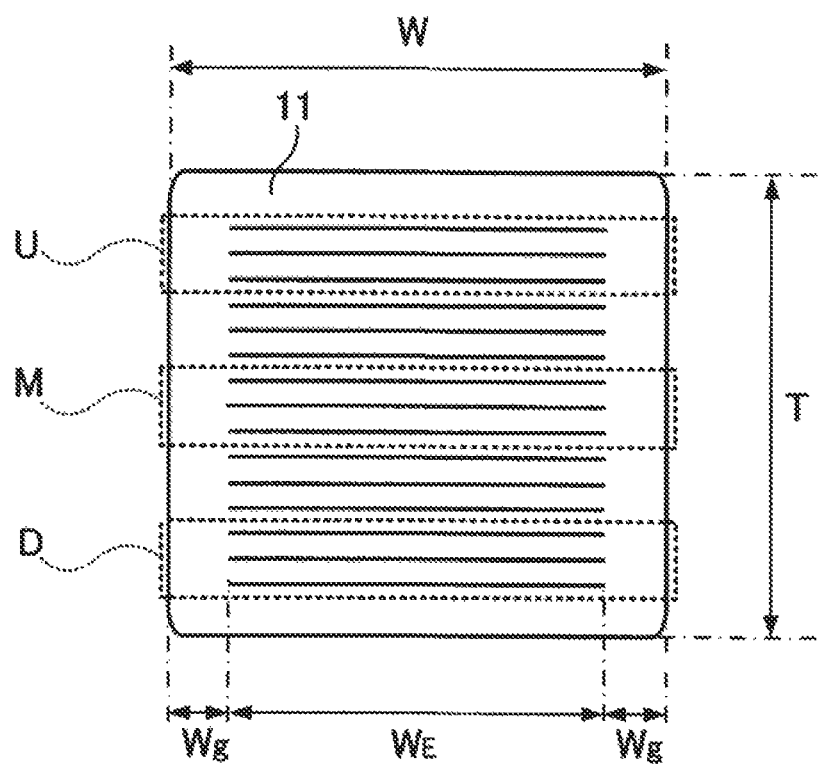
FIG. 7 is a W-T cross-sectional view showing a cross section of the multilayer ceramic capacitor as seen from the end surface side.

Referring to FIG. 7, methods of measuring the width dimension $W_E$ of the internal electrode and the dimension Wg of the width gap will be hereinafter described. FIG. 7 is a W-T cross-sectional view showing a cross section of the multilayer ceramic capacitor as seen from the end surface side.

In the present specification, the width dimension $W_E$ of the internal electrode means an average width calculated by measuring the widths of a plurality of internal electrodes. Furthermore, the dimension Wg of the width gap means an average dimension of the width gap calculated by measuring the plurality of width gaps.

In measurement, the stacked body 11 is first polished from its end surface to a position corresponding to one half of the length of stacked body 11, to thus expose a W-T cross section shown in FIG. 7. The exposed W-T cross section is subjected to an etching process as required, thus removing the internal electrode extended by polishing.

As shown in FIG. 7, an optical microscope is used to image three portions in the exposed W-T cross section that include the upper portion U, the center portion M and the lower portion D arranged in this order in the stacking direction to measure the width of each internal electrode. Also, line segments parallel or substantially parallel to each other in the W direction are drawn from the end portion of the internal electrode toward the side surface of stacked body 11. Then, the dimension of each width gap is measured from the length of each of the line segments. Then, an average value of the dimensions of the internal electrode widths and an average value of the dimensions of the width gaps are calculated in each of the upper portion U, the center portion M, and the lower portion D. Then, the calculated three average values of the dimensions of the internal electrode widths in the upper portion U, the center portion M and the lower portion D are averaged to thus obtain a width dimension $W_E$ of the internal electrode. Also, the calculated three average values of the dimensions of the width gaps in the upper portion U, the center portion M and the lower portion D are averaged to thus obtain a dimension Wg of the width gap.

In addition, the width dimension $W_E$ of the internal electrode can also be calculated by reducing the dimensions Wg of the width gaps on both sides of the internal electrode from the width dimension W of stacked body 11. Specifically, the relation of $W_E=W-2Wg$ is established.

The description of the multilayer ceramic capacitor 100 according to the first preferred embodiment will be hereinafter resumed.

In the multilayer ceramic capacitor 100 according to the present preferred embodiment, the two internal electrodes 4a and 4b adjacent to each other continuously in the stacking direction are connected to one external electrode 2a, two internal electrodes 4c and 4d adjacent to each other continuously in the stacking direction are connected to the other external electrode 2b, two internal electrodes 4e and 4f adjacent to each other continuously in the stacking direction are connected to one external electrode 2a, and two internal electrodes 4g and 4h adjacent to each other continuously in the stacking direction are connected to the other external electrode 2b.

In the multilayer ceramic capacitor 100, a set of internal electrodes 4a and 4b, a set of internal electrodes 4c and 4d, a set of internal electrodes 4e and 4f, and a set of internal electrodes 4g and 4h are connected to the external electrode 2a or the external electrode 2b. Accordingly, even if the thickness dimension $T_E$ of each of internal electrodes 4a to 4h is relatively small, generally high conductivity is ensured and a decrease in Q value is significantly reduced or prevented.

Although the number of a plurality of internal electrodes 4a to 4h defined as one set is optional, the two internal electrodes are preferable as in the present preferred embodiment. If the number of the internal electrodes 4a to 4h defined as one set is three or more, it becomes difficult to ensure the number of internal electrodes 4a to 4h required to provide a capacitance within the limited thickness dimension T of the stacked body 1.

In the multilayer ceramic capacitor 100 according to the present preferred embodiment, an auxiliary electrode 5a is located opposite to the internal electrode 4a at a distance from the internal electrode 4a between the dielectric ceramic layer 3a and the dielectric ceramic layer 3b. The dimension of the length gap corresponding to a distance between the internal electrode 4a and the auxiliary electrode 5a in the length direction of the stacked body 1 is defined as Lg. An auxiliary electrode 5a is connected to the external electrode 2b.

Similarly, an auxiliary electrode 5b is located opposite to the internal electrode 4b; an auxiliary electrode 5c is located opposite to the internal electrode 4c; an auxiliary electrode 5d is located opposite to the internal electrode 4d; an auxiliary electrode 5e is located opposite to the internal electrode 4e; an auxiliary electrode 5f is located opposite to the internal electrode 4f; an auxiliary electrode 5g is located opposite to the internal electrode 4g; and an auxiliary electrode 5h is located opposite to the internal electrode 4h.

Auxiliary electrodes 5a to 5h are provided, thus improving the connectivity between the external electrode and the internal electrode, so that the connection resistance is lowered.

In addition, it is preferable that the dimension Lg of each of the length gaps between the internal electrodes 4a to 4h and the auxiliary electrodes 5a to 5h, respectively, preferably is about 60 μm or more, for example. In the case where the dimension Lg of the length gap is less than about 60 μm, a short circuit may occur between the internal electrodes 4a to 4h and the auxiliary electrodes 5a to 5h, respectively, in a portion corresponding to the length gap. Furthermore, in the case where the dimension Lg of the length gap is about 60 μm or more, the difference between the thickness of internal electrodes 4a to 4h and the thickness of dielectric ceramic layers 3a to 3i is absorbed, so that the occurrence of structural defects is significantly reduced or prevented.

Multilayer ceramic capacitor 100 according to the present preferred embodiment including the above-described structure can be manufactured, for example, by the method as described below.

First, a plurality of ceramic green sheets, a conductive paste for an internal electrode, and a conductive paste for an external electrode are prepared. Each of the ceramic green sheets and the conductive pastes contains a binder and a solvent, which can be a known organic binder and organic solvent, respectively.

Then, the conductive paste for an internal electrode is printed on some of the ceramic green sheets in a prescribed pattern, for example, by screen printing or the like, to form an internal electrode pattern. Such an internal electrode pattern is not provided on the remaining ceramic green sheets.

Then, a prescribed number of outer layer ceramic green sheets each having no internal electrode pattern provided thereon are stacked, on which the ceramic green sheets each including an internal electrode pattern provided thereon are sequentially stacked, on which a prescribed number of the outer layer ceramic green sheets each having no internal electrode pattern provided thereon are stacked, thus fabricating a mother stacked body.

Then, the mother stacked body is pressed in the stacking direction by hydrostatic pressure pressing and the like.

Then, the mother stacked body is cut into a prescribed size to obtain an unfired stacked body 1'. Then, the unfired stacked body 1' may be subjected to barrel polishing and the like, so that the corner portion and the ridge portion of the unfired stacked body 1' may be rounded.

Then, the unfired stacked body 1' is fired. The firing temperature differs depending on the materials of the dielectric ceramic and the internal electrode, but is preferably about 900° C. or more and 1300° C. or less, for example. This consequently leads to fabrication of a stacked body 1 having a rectangular or substantially rectangular parallelepiped shape and including a plurality of dielectric ceramic layers 3a to 3i and a plurality of internal electrodes 4a to 4h stacked on each other.

Then, the conductive paste for an external electrode is applied on both end surfaces of stacked body 1, which is then baked, to thus define an underlying layer for each of a pair of external electrodes 2a and 2b. It is preferable that the baking temperature is about 700° C. or more and about 900° C. or less, for example.

Then, the surface of the underlying layer of each of the pair of external electrodes 2a and 2b is plated as required. For example, an Ni plating layer as the first layer and an Sn plating layer as the second layer each are preferably formed by electrolysis plating. Thus, the multilayer ceramic capacitor 100 according to the present preferred embodiment is completed.

Figure 8A:
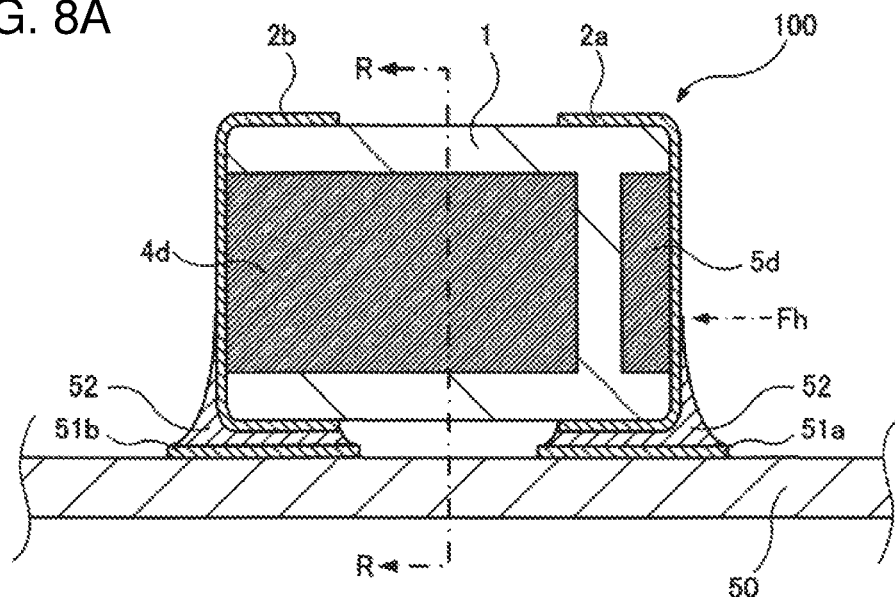
FIG. 8A is a cross-sectional view showing a mounting structure of the multilayer ceramic capacitor according to the first preferred embodiment of the present invention.
Figure 8B:
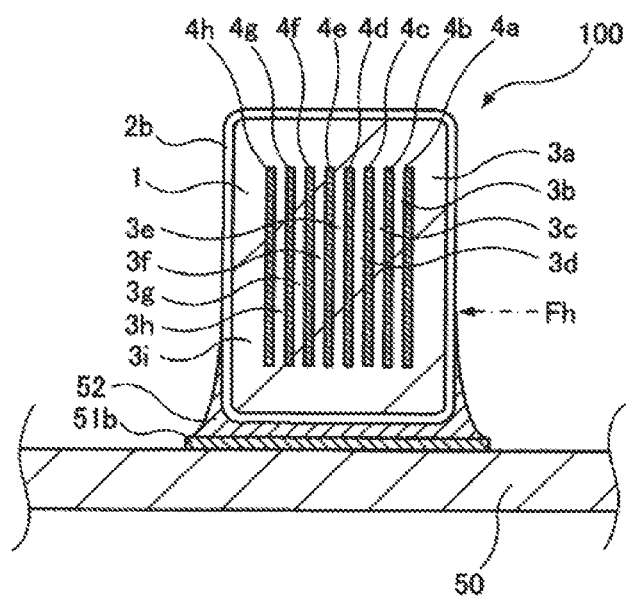
FIG. 8B is a cross-sectional view showing the mounting structure of the multilayer ceramic capacitor according to the first preferred embodiment of the present invention, as seen in the direction indicated by line arrows R-R in FIG. 8A.

Then, a desirable example of a mounting structure of the multilayer ceramic capacitor 100 will be hereinafter described. FIG. 8A is a cross-sectional view showing a mounting structure of the multilayer ceramic capacitor according to the first preferred embodiment of the present invention. FIG. 8B is a cross-sectional view showing the mounting structure of the multilayer ceramic capacitor according to the first preferred embodiment of the present invention, as seen in the direction indicated by line arrows R-R in FIG. 8A.

As shown in FIGS. 8A and 8B, the mounting structure includes a substrate 50. The land electrodes 51a and 51b are provided on the surface of the substrate 50. The external electrode 2a of the multilayer ceramic capacitor 100 is joined to the land electrode 51a with solder 52. The external electrode 2b of the multilayer ceramic capacitor 100 is joined to the land electrode 51b with the solder 52.

In this mounting structure, the normal directions of the internal electrodes 4a to 4h of the multilayer ceramic capacitor 100 and the normal direction of the substrate 50 are perpendicular to each other.

In the mounting structure, the first side surface 1c or the second side surfaces 1d of the stacked body 1 of the multilayer ceramic capacitor 100 shown in FIG. 1 is arranged so as to face the substrate 50.

In the mounting structure, since the internal electrodes 4a to 4h are arranged perpendicular or substantially perpendicular to the substrate 50, a current distribution is rendered uniform in elements each including one dielectric ceramic layer and two internal electrodes sandwiching the dielectric ceramic layer therebetween, so that the Q value in the high frequency region is increased. For example, although the element including dielectric ceramic layer 3c and internal electrodes 4b and 4c and the element including dielectric ceramic layer 3g and internal electrodes 4f and 4g are located at a distance from each other in the stacking direction within the stacked body 1, a current distribution is rendered uniform in these elements, so that the Q value in the high frequency region is increased.

In the mounting structure, it is preferable that an uppermost portion Fh of the fillet defined by the solder 52 overlaps with the internal electrodes 4a to 4h in the width direction of the stacked body 1. The uppermost portion Fh of the fillet overlaps with the internal electrodes 4a to 4h, so that the Q value is further increased.

Figure 9A:
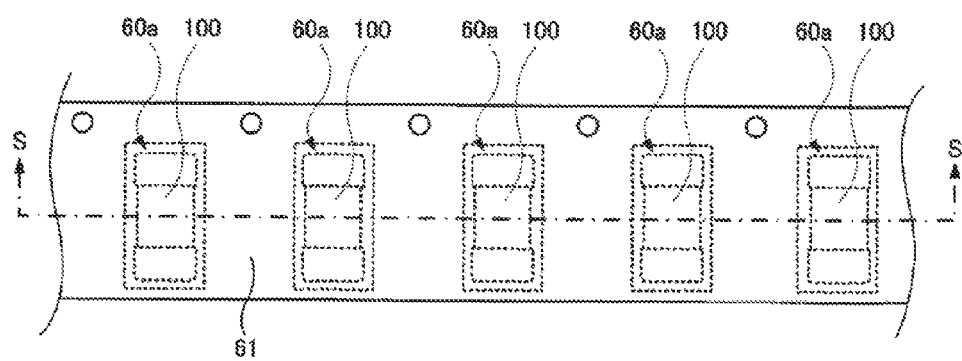
FIG. 9A is a plan view showing the configuration of a taped electronic component array housing each multilayer ceramic capacitor according to the first preferred embodiment of the present invention.
Figure 9B:
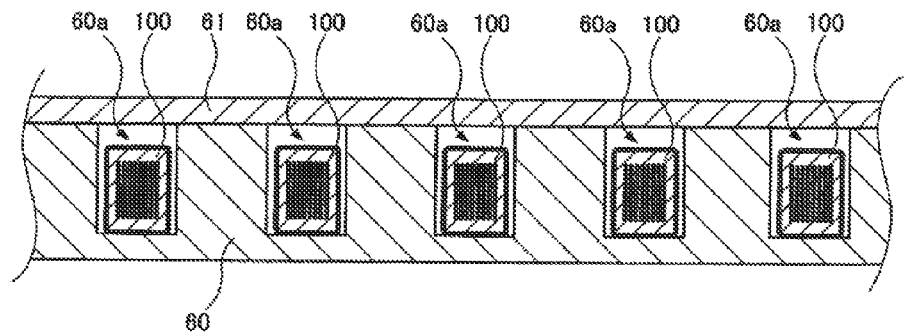
FIG. 9B is a cross-sectional view showing the configuration of the taped electronic component array housing each multilayer ceramic capacitor according to the first preferred embodiment of the present invention, as seen in the direction indicated by line arrows S-S in FIG. 9A.

Then, a desirable example of the taped electronic component array housing multilayer ceramic capacitor 100 will be hereinafter described. FIG. 9A is a plan view showing the configuration of a taped electronic component array housing the multilayer ceramic capacitor according to the first preferred embodiment of the present invention. FIG. 9B is a cross-sectional view showing the configuration of the taped electronic component array housing the multilayer ceramic capacitor according to the first preferred embodiment of the present invention, as seen in the direction indicated by line arrows S-S in FIG. 9A.

As shown in FIGS. 9A and 9B, the taped electronic component array includes a carrier tape 60 and a cover tape 61. The carrier tape 60 preferably is made of resin or paper, and has an elongated shape. In the carrier tape 60, a plurality of concave portions 60a are located at a distance from each other along the longitudinal direction. The cover tape 61 preferably is made of resin or paper, and has an elongated shape.

Each concave portion 60a in the carrier tape 60 is sealed by the cover tape 61 in the state where the multilayer ceramic capacitor 100 is housed in each concave portion 60a of the carrier tape 60. In the taped electronic component array, the normal direction of each of the internal electrodes 4a to 4h of the multilayer ceramic capacitor 100 and the normal direction of the bottom surface of each concave portion 60a in the carrier tape 60 are perpendicular or substantially perpendicular to each other.

In the taped electronic component array, the first side surface 1c or the second side surface 1d of the stacked body 1 of the multilayer ceramic capacitor 100 shown in FIG. 1 is arranged so as to face the bottom surface of each concave portion 60a of the carrier tape 60.

In the taped electronic component array, when the cover tape 61 is peeled from the carrier tape 60, the first side surface 1c or the second side surface 1d of the stacked body 1 of the multilayer ceramic capacitor 100 is located in an opening of the concave portion 60a. When the first side surface 1c or the second side surface 1d is adsorbed, for example, by vacuum absorption using a mounting machine and mounted on the substrate, the mounting structure of multilayer ceramic capacitor 100 shown in each of FIGS. 8A and 8B is able to be readily implemented.

Second Preferred Embodiment

Figure 10:
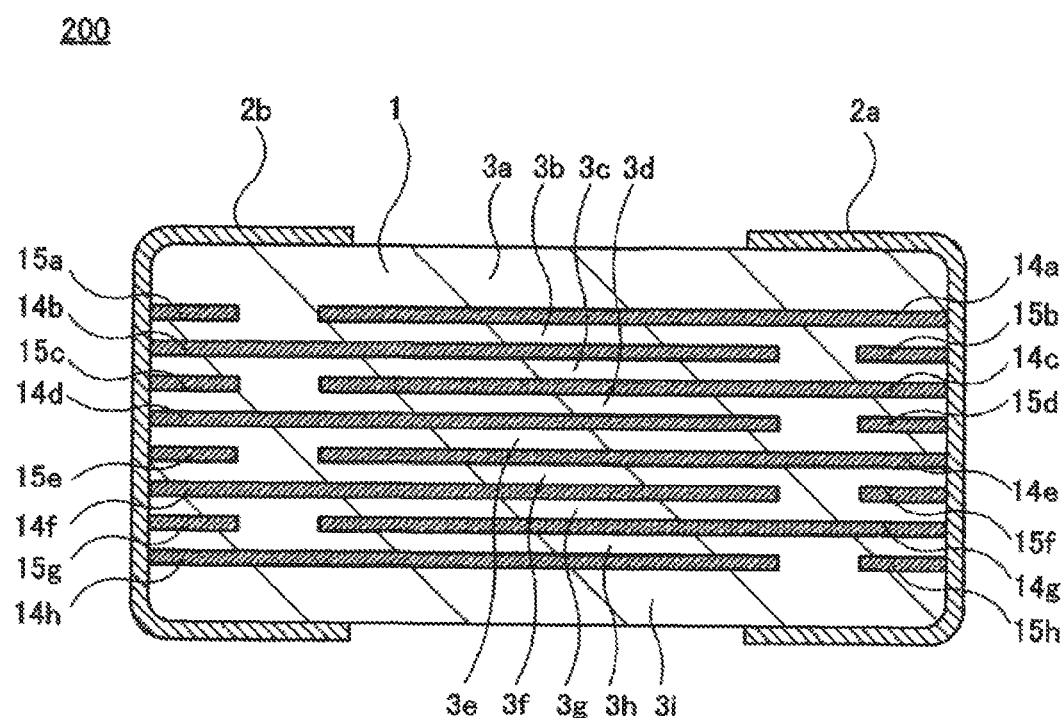
FIG. 10 is a cross-sectional view showing the configuration of a multilayer ceramic capacitor according to a second preferred embodiment of the present invention.

A multilayer ceramic capacitor 200 according to the second preferred embodiment of the present invention will be hereinafter described. FIG. 10 is a cross-sectional view showing the configuration of a multilayer ceramic capacitor according to the second preferred embodiment of the present invention.

In the multilayer ceramic capacitor 100 according to the first preferred embodiment shown in each of FIGS. 1 to 4, two adjacent internal electrodes 4a and 4b are connected to one external electrode 2a, two adjacent internal electrodes 4c and 4d are connected to the other external electrode 2b, two adjacent internal electrodes 4e and 4f are connected to one external electrode 2a, and two adjacent internal electrodes 4g and 4h are connected to the other external electrode 2b. In this way, every two internal electrodes selected from internal electrodes 4a to 4h are defined as one set and connected to external electrode 2a or external electrode 2b. On the other hand, in multilayer ceramic capacitor 200 according to the second preferred embodiment of the present invention, the internal electrodes 14a to 14h are one by one connected alternately to the external electrode 2a and the external electrode 2b. Due to this difference in connecting the internal electrodes 14a to 14h to the external electrodes 2a and 2b, positions at which the auxiliary electrodes 15a to 15h are located are also different from those in the multilayer ceramic capacitor 100 according to the first preferred embodiment.

Since other configurations of the multilayer ceramic capacitor 200 according to the second preferred embodiment of the present invention are the same as those of multilayer ceramic capacitor 100 according to the first preferred embodiment, the description thereof will not be repeated.

In FIG. 10, the number of the dielectric ceramic layers 3a to 3i preferably is nine and the number of the internal electrodes 4a to 4h preferably is eight, for example. However, the number of the dielectric ceramic layers 3a to 3i and the number of the internal electrodes 14a to 14h are optional, and may be determined in accordance with the capacitance required for the multilayer ceramic capacitor 200.

In this way, the multilayer ceramic capacitor 200 according to the second preferred embodiment of the present invention can be configured such that the internal electrodes 14a to 14h are one by one connected alternately to the external electrode 2a and the external electrode 2b.

Descriptions have been given with regard to the structure of the multilayer ceramic capacitor 100 according to the first preferred embodiment, an example of the manufacturing method, an example of the mounting structure, an example of the taped electronic component array housing multilayer ceramic capacitor 100, and the structure of multilayer ceramic capacitor 200 according to the second preferred embodiment. However, the present invention is not limited to the above, but can be variously modified in accordance with the present invention. Furthermore, elements and features can be extracted from each preferred embodiment and also be combined for implementation.

For example, in each of the multilayer ceramic capacitors 100 and 200, the auxiliary electrodes 5a to 5h and 15a to 15h are not indispensable, and do not necessarily have to be provided.

Furthermore, the number of the ceramic layers and the number of the internal electrodes included in the stacked body 1 are also optional, and can be determined in accordance with the electrostatic capacitance desired for each of the multilayer ceramic capacitors 100 and 200.

Furthermore, the structure and the number of each of the external electrodes 2a and 2b are also optional, and not limited to the above.

Experimental Examples

The following experimental simulations were performed in order to confirm the effectiveness of the various preferred embodiments of the present invention.

First, as an Example, five types of multilayer ceramic capacitors each having the structure of the multilayer ceramic capacitor 100 according to the first preferred embodiment described above were formed. These five types of multilayer ceramic capacitors each had an electrostatic capacitance of about 0.7 pF, about 1.0 pF, about 1.5 pF, about 2.0 pF, and about 3.0 pF, respectively, for example.

In the Example, the stacked body 1 was configured to have a length dimension L of about 0.4 mm, a width dimension W of about 0.3 mm, and a thickness dimension T of about 0.2 mm.

Also, in the Example, the internal electrodes 14a to 14h each were configured to have a width dimension $W_E$ of about 0.2 mm that was about 68% of the width dimension W of stacked body 1. The thickness dimension $T_E$ of each of the internal electrodes 14a to 14h was about 1.5 μm. It is to be noted that the number of the internal electrodes 14a to 14h was set in accordance with the required electrostatic capacitance value.

On the other hand, in the Comparative Example, the stacked body was configured to have a length dimension L of 0.4 mm, a width dimension W of 0.2 mm, and a thickness dimension T of 0.2 mm.

Also, in the Comparative Example, the internal electrode was configured to have width dimension $W_E$ of about 0.09 mm that was 45% of width dimension W of the stacked body. The thickness dimension $T_E$ of the internal electrode was 1.5 μm. It is to be noted that the number of the internal electrodes was set in accordance with the required electrostatic capacitance value.

Figure 11:
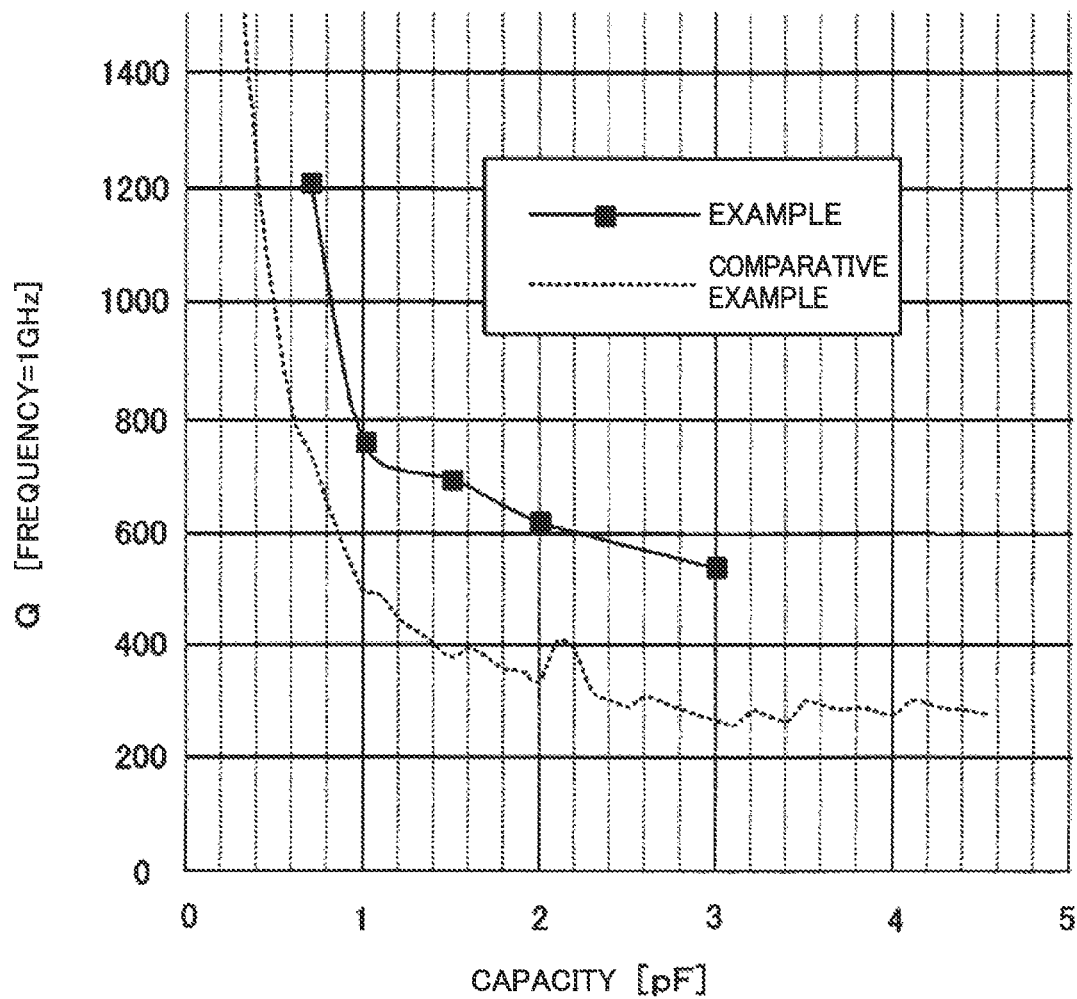
FIG. 11 is a graph showing a Q value at a frequency of 1 GHz in each of an Example and a Comparative Example.

FIG. 11 is a graph showing a Q value at a frequency of 1 GHz in each of the Example and the Comparative Example. It could be confirmed that preferred embodiments of the present invention have effectiveness since Example exhibits a Q value that is higher than that in Comparative Example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
   a stacked body including a stack of a plurality of dielectric layers and a plurality of internal electrodes, and including a first main surface and a second main surface that are opposed to each other in a stacking direction, a first side surface and a second side surface that are opposed to each other in a width direction perpendicular or substantially perpendicular to the stacking direction, and a first end surface and a second end surface that are opposed to each other in a length direction perpendicular or substantially perpendicular to each of the stacking direction and the width direction; and a pair of external electrodes provided on the first end surface and the second end surface, respectively, of the stacked body; wherein each of the internal electrodes is connected at one of the first end surface and the second end surface to a corresponding one of the external electrodes;

in the stacked body, assuming that a dimension between the first end surface and the second end surface is defined as a length dimension, a dimension between the first side surface and the second side surface is defined as a width dimension, and a dimension between the first main surface and the second main surface is defined as a thickness dimension, the width dimension is greater than the thickness dimension, the length dimension is about 0.4 mm or less, the width dimension is about 0.15 mm or more and about 0.35 mm or less, the thickness dimension is about 0.2 mm or less, the internal electrode is made of Cu or Ag as a main component, and a width dimension of the internal electrode is about 60% or more of the width dimension of the stacked body;

an auxiliary electrode is provided inside the stacked body; and the auxiliary electrode and one of the plurality of internal electrodes are provided on a common dielectric layer of the plurality of dielectric layers.

2. The multilayer ceramic capacitor according to claim 1, wherein the internal electrode has a thickness dimension of about 1.2 μm or more and about 2.4 μm or less.

3. The multilayer ceramic capacitor according to claim 1, wherein a dimension of a width gap having no internal electrode provided therein between the internal electrode and the first side surface or the second side surface of the stacked body is about 25 μm or more.

4. The multilayer ceramic capacitor according to claim 1, wherein a number of the plurality of internal electrodes that are adjacent to each other continuously in the stacking direction are connected to one of the external electrodes, and a number of the plurality of internal electrodes that are adjacent to each other continuously in the stacking direction and not connected to the one of the external electrodes are connected to the other of the external electrodes.

5. The multilayer ceramic capacitor according to claim 4, wherein two of the internal electrodes that are adjacent to each other continuously in the stacking direction are connected to one of the external electrodes, and two of the internal electrodes that are adjacent to each other continuously in the stacking direction and not connected to the one of the external electrodes are connected to the other of the external electrodes.

6. A mounting structure of a multilayer ceramic capacitor, in which the external electrode of the multilayer ceramic capacitor according to claim 1 is joined by solder to a land electrode provided on a substrate;

a normal direction of the internal electrode in the multilayer ceramic capacitor and a normal direction of the substrate being perpendicular or substantially perpendicular to each other.

7. A mounting structure of a multilayer ceramic capacitor, in which the external electrode of the multilayer ceramic capacitor according to claim 1 is joined by solder to a land electrode provided on a substrate;

the stacked body being disposed such that the first side surface or the second side surface of the stacked body faces the substrate.

8. A taped electronic component array comprising:

an elongated carrier tape in which a plurality of concave portions are provided; and an elongated cover tape covering the plurality of concave portions in the carrier tape; wherein the multilayer ceramic capacitor according to claim 1 is housed in each of the plurality of concave portions; and a normal direction of the internal electrode of the multilayer ceramic capacitor and a normal direction of a bottom surface of each of the plurality of concave portions is perpendicular or substantially perpendicular to each other.

9. The taped electronic component array according to claim 8, wherein the internal electrode has a thickness dimension of about 1.2 μm or more and about 2.4 μm or less.

10. The taped electronic component array according to claim 8, wherein a dimension of a width gap having no internal electrode provided therein between the internal electrode and the first side surface or the second side surface of the stacked body is about 25 μm or more.

11. The taped electronic component array according to claim 8, wherein a number of the plurality of internal electrodes that are adjacent to each other continuously in the stacking direction are connected to one of the external electrodes, and a number of the plurality of internal electrodes that are adjacent to each other continuously in the stacking direction and not connected to the one of the external electrodes are connected to the other of the external electrodes.

12. The taped electronic component array according to claim 11, wherein two of the internal electrodes that are adjacent to each other continuously in the stacking direction are connected to one of the external electrodes, and two of the internal electrodes that are adjacent to each other continuously in the stacking direction and not connected to the one of the external electrodes are connected to the other of the external electrodes.

13. A taped electronic component array comprising:

an elongated carrier tape in which a plurality of concave portions are provided; and an elongated cover tape covering the plurality of concave portions in the carrier tape; wherein the multilayer ceramic capacitor according to claim 1 is housed in each of the plurality of concave portions; and the first side surface or the second side surface of the stacked body of the multilayer ceramic capacitor is disposed so as to face a bottom surface of each of the plurality of concave portions.

14. The taped electronic component array according to claim 13, wherein the internal electrode has a thickness dimension of about 1.2 μm or more and about 2.4 μm or less.

15. The taped electronic component array according to claim 13, wherein a dimension of a width gap having no internal electrode provided therein between the internal electrode and the first side surface or the second side surface of the stacked body is about 25 μm or more.

16. The taped electronic component array according to claim 13, wherein a number of the plurality of internal electrodes that are adjacent to each other continuously in the stacking direction are connected to one of the external electrodes, and a number of the plurality of internal electrodes that are adjacent to each other continuously in the stacking direction and not connected to the one of the external electrodes are connected to the other of the external electrodes.

17. The taped electronic component array according to claim 16, wherein two of the internal electrodes that are adjacent to each other continuously in the stacking direction are connected to one of the external electrodes, and two of the internal electrodes that are adjacent to each other continuously in the stacking direction and not connected to the one of the external electrodes are connected to the other of the external electrodes.

* * * * *